(12) United States Patent
Kirk et al.

(10) Patent No.: US 6,967,054 B2
(45) Date of Patent: Nov. 22, 2005

(54) COATING THICKNESS CONTROL USING SURFACE FEATURES

(75) Inventors: Jay Bernard Kirk, Plano, TX (US); Zuhair Hilali, Dallas, TX (US); Duy Phan, Garland, TX (US); Darren S. Lee, Dallas, TX (US); Duane E. Carter, Plano, TX (US); Gary A. Evans, Plano, TX (US); David Alan Willis, Dallas, TX (US)

(73) Assignee: Photodigm, Inc., Richardson, TX (US)

( * ) Notice: Subject to any disclaimer, the term of this patent is extended or adjusted under 35 U.S.C. 154(b) by 106 days.

(21) Appl. No.: 10/382,675

(22) Filed: Mar. 6, 2003

(65) Prior Publication Data

US 2004/0175496 A1 Sep. 9, 2004

(51) Int. Cl.[7] .............................. B32B 3/00; G02F 1/00; G03C 5/00
(52) U.S. Cl. ..................... 428/156; 428/120; 428/167; 428/172; 359/321; 359/566; 430/322
(58) Field of Search .................... 428/156, 192, 428/120, 167, 172; 359/321, 566; 430/321, 430/322

(56) References Cited

U.S. PATENT DOCUMENTS

| | | | | |
|---|---|---|---|---|
| 3,783,520 A | * | 1/1974 | King | 356/508 |
| 4,815,084 A | * | 3/1989 | Scifres et al. | 372/46 |
| 4,903,274 A | * | 2/1990 | Taneya et al. | 372/48 |
| 5,351,262 A | * | 9/1994 | Poguntke et al. | 372/102 |

* cited by examiner

*Primary Examiner*—Donald J. Loney
(74) *Attorney, Agent, or Firm*—Duke W. Yee; Stephen R. Tkacs

(57) ABSTRACT

A uniform coating is provided using surface features. Multiple ridges or other shapes are fabricated near an area of interest to allow for uniform coating in between the ridges. Areas at either ends of the ridges are left open to allow for excess pooling of photoresist liquid and to aid in obtaining uniform coating. The photoresist liquid or other coating fluid is applied to the sample and spun dry. A soft-bake process is performed to evaporate remaining solvents. An element, such as a diffractive, refractive, or reflective grating structure, is then formed in the area of interest using the uniform photoresist coating.

5 Claims, 5 Drawing Sheets

COATING THICKNESS CONTROL USING SURFACE FEATURES

BACKGROUND OF THE INVENTION

1. Technical Field

The present invention relates to applying coatings to substrates and, in particular, to using a spin application to dry a coating on the substrate. Still more particularly, the present invention provides a method, apparatus, and program for using surface features to provide a uniform thickness of coatings on a substrate.

2. Description of the Related Art

Typical holographic exposures require a very thin coating of photoresist (e.g. about 800 angstroms) on a surface to record submicron lines and spaces. On planar surfaces, a coating of a desired thickness is typically obtained by adjusting the viscosity of the photoresist and spinning the sample at moderate speeds (e.g. 3500 rpm), with the photoresist freshly applied, for a set time (e.g. about 30 seconds). As the spinning of the sample begins, centrifugal force moves the excess liquid photoresist to the edge and off the sample, evaporating some of the solvents in the photoresist and leaving a coating of the solids, contained in the photoresist on the surface of the sample. This coating process is typically completed with a soft-bake to evaporate the remaining solvents.

In the case of non-planar samples, a combination of centrifugal force, surface tension forces, and features rising out of the plane of the sample surface results in a non-uniform coating across the sample. Generally, at the onset of spinning, photoresist moves outward from the center of the sample and encounters a feature rising above the plane of the surface. The photoresist accumulates at the rise of the feature, leaving a thick coating at the rise of the feature and then leaving a thin coating after the fall of the feature. Rotational forces and surface tensions that are present on the surface complicate the non-uniformity created by this process.

A photoresist may be used to form a feature or component on the surface of the sample. In some applications, a non-uniform photoresist coating may result in an unreliable performance of the resulting component. More particularly, fabrication of a diffraction, refraction, or reflection grating structures for Light Amplification by the Simulated Emission of Radiation (laser) may be adversely affected by an uneven coating. To make an accurate and effective grating, a uniform photoresist coating must be formed in the area of interest. Non-uniform photoresist coating may also affect other fabrication processes, such as grayscale masks.

Therefore, it would be advantageous to provide coating thickness control to ensure uniform distribution of photoresist using a spin coating process.

SUMMARY OF THE INVENTION

The present invention provides a uniform coating using surface features. By taking advantage of surface tensions created by features out of the plane of the surface of a sample, photoresist thickness non-uniformities in areas of interest can be avoided. Specifically, multiple ridges or other shapes are fabricated in an area of interest to allow for uniform coating in between the ridges. Areas at either ends of the ridges can be left open to allow for excess pooling of photoresist liquid and to aid in obtaining uniform coating. The photoresist liquid or other coating fluid is applied to the sample and spun dry. A soft-bake process may also be performed to evaporate remaining solvents. An element, such as a diffractive, refractive, or reflective grating structure, may then be formed in the area of interest using the uniform photoresist.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

Figure 1:
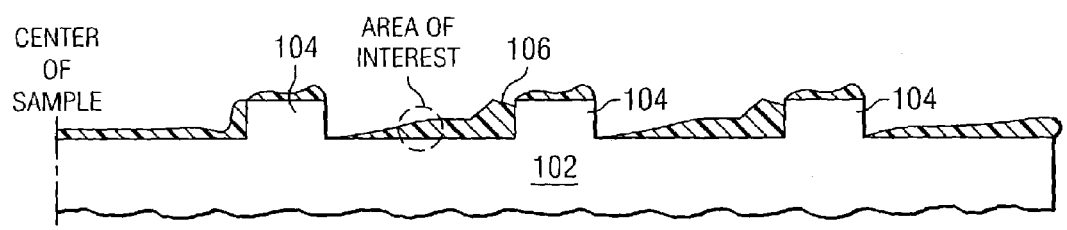
FIG. 1 is a diagram illustrating an example substrate with a non-uniform coating due to surface features.

With reference now to the figures and in particular with reference to FIG. 1, a diagram is shown illustrating an example substrate with a non-uniform coating due to surface features. Spin coating is a common process for depositing photoresist on semiconductor wafers. Typically the wafer is flat and the photoresist material is uniformly spread over the wafer by centrifugal forces caused by the spinning motion. When the substrate has pre-existing surface features, the flow process is much more complicated. In the example shown in FIG. 1, sample substrate 102 includes pre-existing surface features 104 and photoresist 106 is applied using a spin coating process. In general, the photoresist tends to follow the general shape of the pre-existing surface features. When the photoresist is very thin when compared to the wafer feature heights, the photoresist is not able to coat all areas of the substrate with a uniform thickness. The resulting surface profile from the spin coating process is a result of competition of centrifugal forces, viscous forces, and surface tension forces.

Centrifugal forces are body forces caused by the spinning motion of the wafer, forcing the liquid radially outward from the center of the sample. Viscous forces counteract the centrifugal forces by retarding the flow. In normal fluid flow problems, surface tension effects are negligible, such as with pipe flow. However, surface tension forces are important in spin coating, particularly with pre-existing wafer features, because of the large surface to volume ratio of the fluid.

Figure 2A:
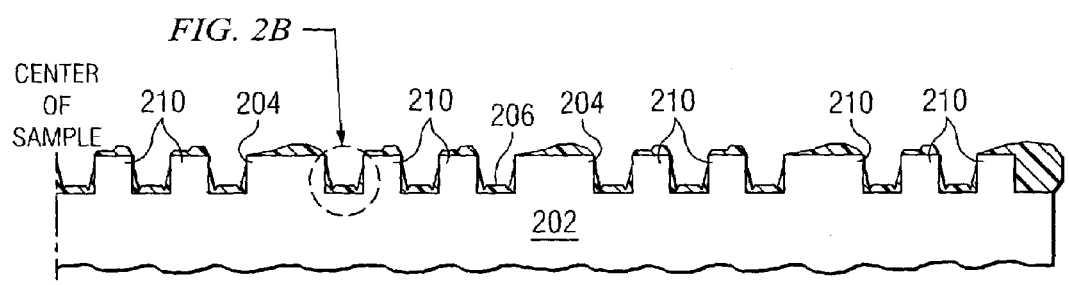
FIGS. 2A and 2B illustrate an example substrate with additional surface features in accordance with a preferred embodiment of the present invention.
Figure 2B:
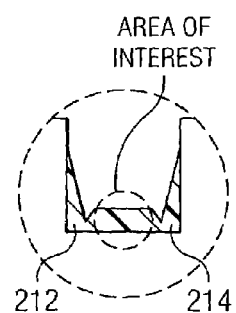

Surface tension forces act over short distances and tend to smooth out a liquid surface. In accordance with a preferred embodiment of the present invention, additional surface features are added to the wafer to increase the surface tension forces. FIGS. 2A and 2B illustrate an example substrate with additional surface features in accordance with a preferred embodiment of the present invention. Sample substrate 202 includes pre-existing surface features 204. Artificial features, such as ridges 210, are placed around the area of interest a small distance apart. The result is high surface tension forces, leading to uniform photoresist thickness over the area of interest.

However, in order to create a uniform photoresist thickness over the area of interest, it is important that the artificial features not be spaced too closely. This is because a thinning of the photoresist occurs at locations immediately after 212 and before 214 a surface feature. This thinning effect is a result of the complicated interplay of viscous, centrifugal, and surface tension forces that occur during the spin coating process. Near the features, there is an increase in surface tension forces due to the change in wafer curvature. Thus, there is a range of artificial feature spacing for which a uniform thickness of photoresist occurs over the region of interest without thinned-out regions developing over the photoresist. The result is a substantially flat and uniform coating thickness in the area of interest, compared to the photoresist coating in the example without added surface features shown in FIG. 1.

With reference now to FIGS. 3A–3D, examples of wafers fabricated with surface features are shown in accordance with a preferred embodiment of the present invention. More particularly with reference to FIG. 3A, an example wafer with pre-existing surface features is shown. The example shown includes a wafer or a portion of a wafer with a region in which a grating is to be formed. The wafer includes regions of interest 302, 304, 306 between pre-existing surface features, such as ridges 300. If photoresist is applied to the wafer in this state, the photoresist will tend to follow the shape of the pre-existing surface features.

Figure 3A:
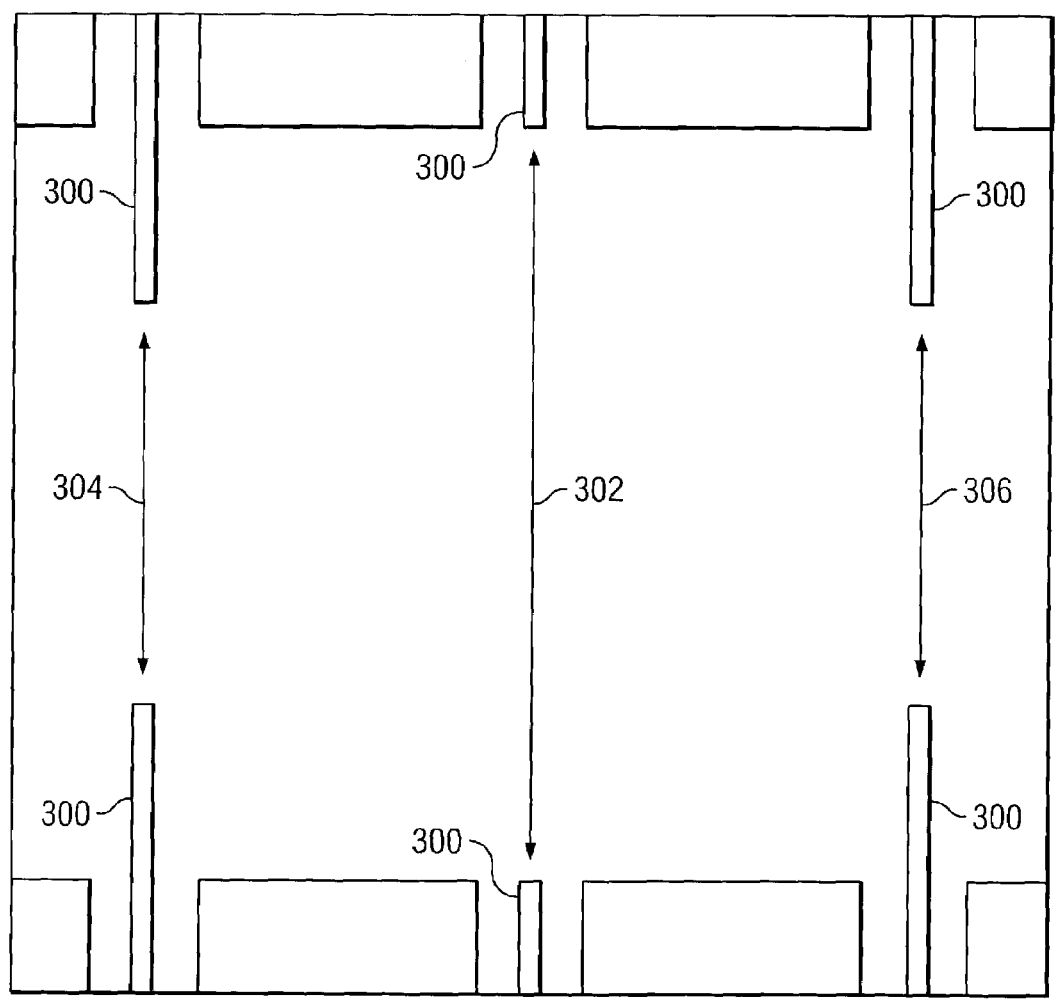
FIGS. 3A–3D are examples of wafers fabricated with surface features in accordance with a preferred embodiment of the present invention.
Figure 3B:
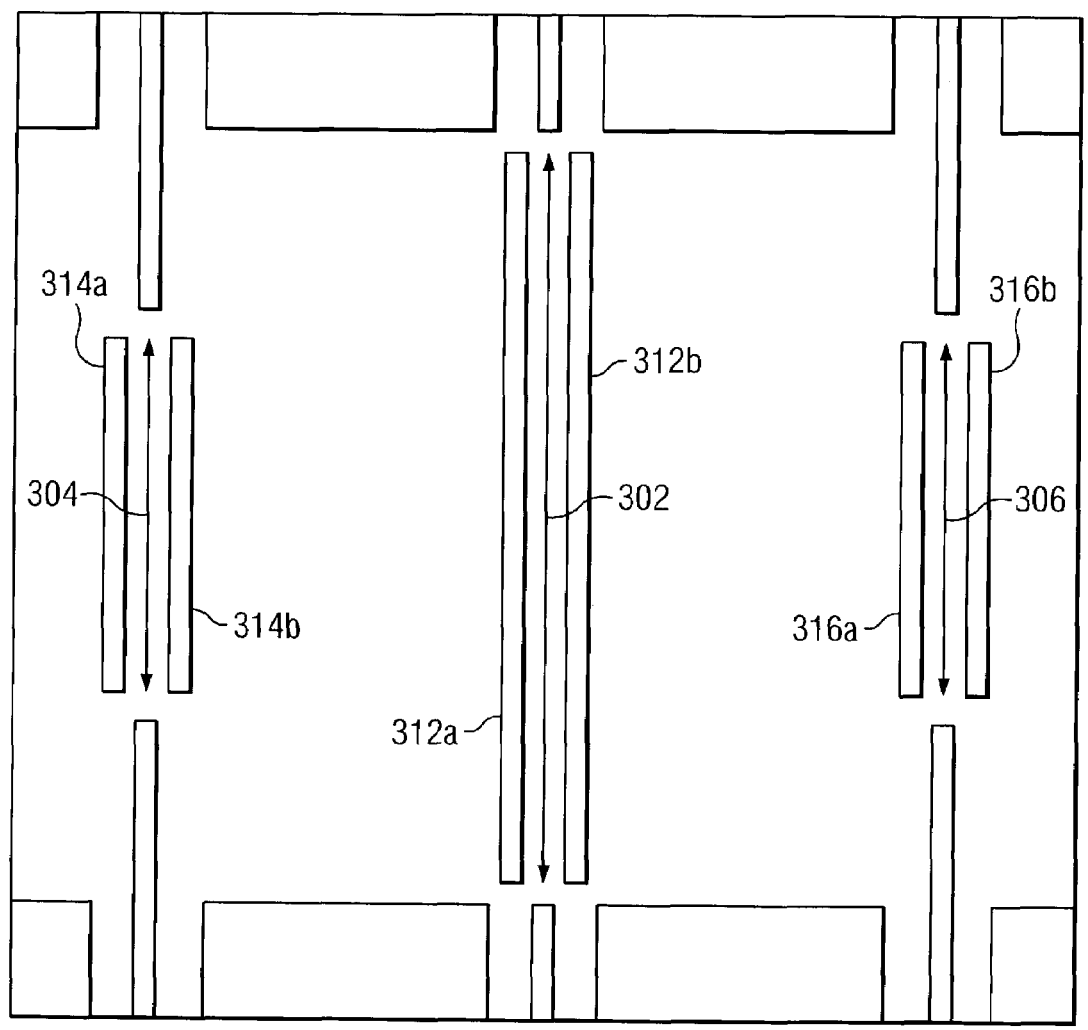

Turning now to FIG. 3B, an example wafer with added surface features near the area of interest is shown. More specifically, ridges 312a, 312b are added near region 302, ridges 314a, 314b are added near region 304, and ridges 316a, 316b are added near region 306. These artificial surface features will cause a thinning of the photoresist to occur at locations immediately after and immediately before a surface feature. In other words, the ridges create surface tension forces that will cause a thinning effect within regions 302, 304, 306, which helps to create a more flat and uniform photoresist coating in the regions of interest.

Figure 3C:
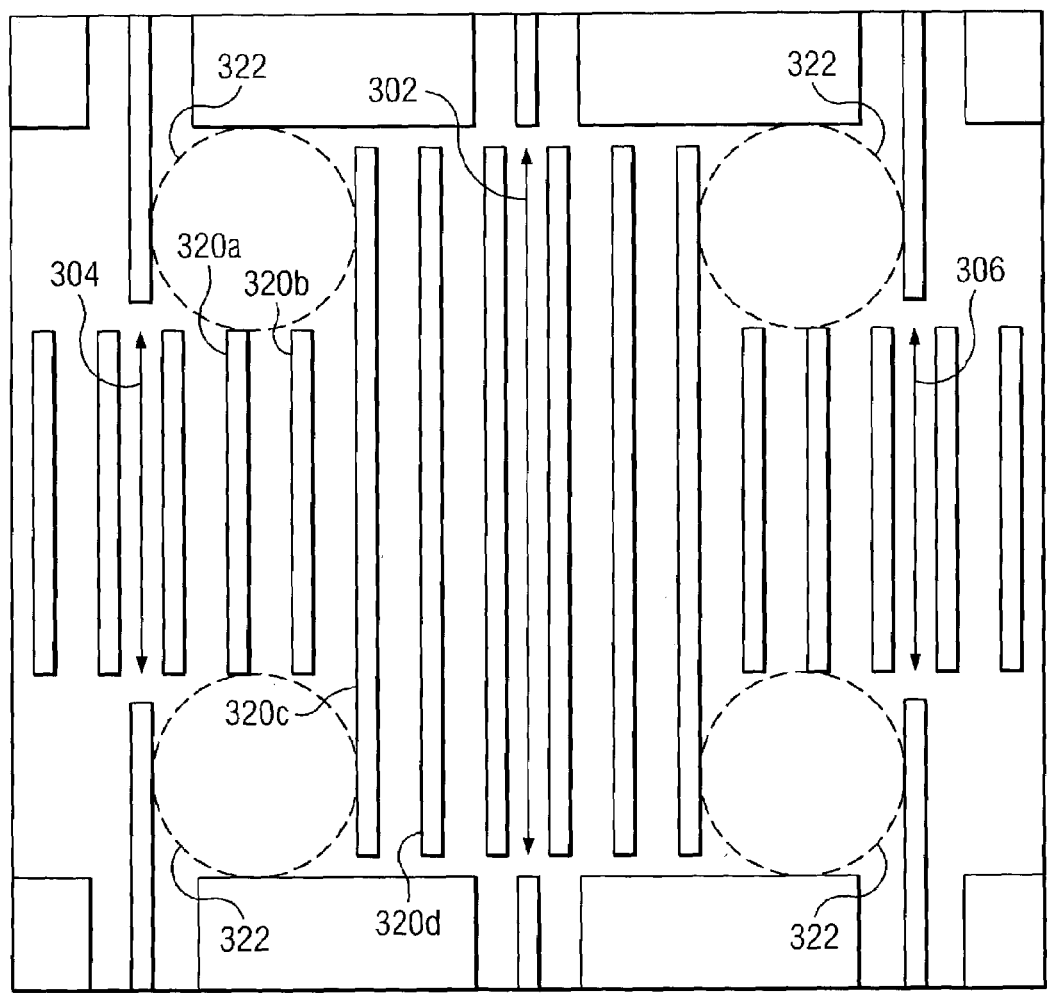

However, the other open areas in the wafer may contribute to the photoresist liquid accumulating near or within the areas of interest. Even with the added surface features, the photoresist coating may be non-uniform, which may affect the regions of interest. With reference now to FIG. 3C, an example wafer with artificial surface features near the area of interest and open pooling areas is depicted. Open spaces are filled with surface features, such as ridges 320a, 320b, 320c, 320d. Since the majority of the wafer, or a selected portion thereof, includes artificial surface features, the surface tension forces contribute toward an even distribution of photoresist fluid. Areas at the ends of the ridges are left open to form pooling areas 322. These vacant areas allow for pooling of excess photoresist, which aids in obtaining a substantially uniform coating thickness.

Figure 3D:
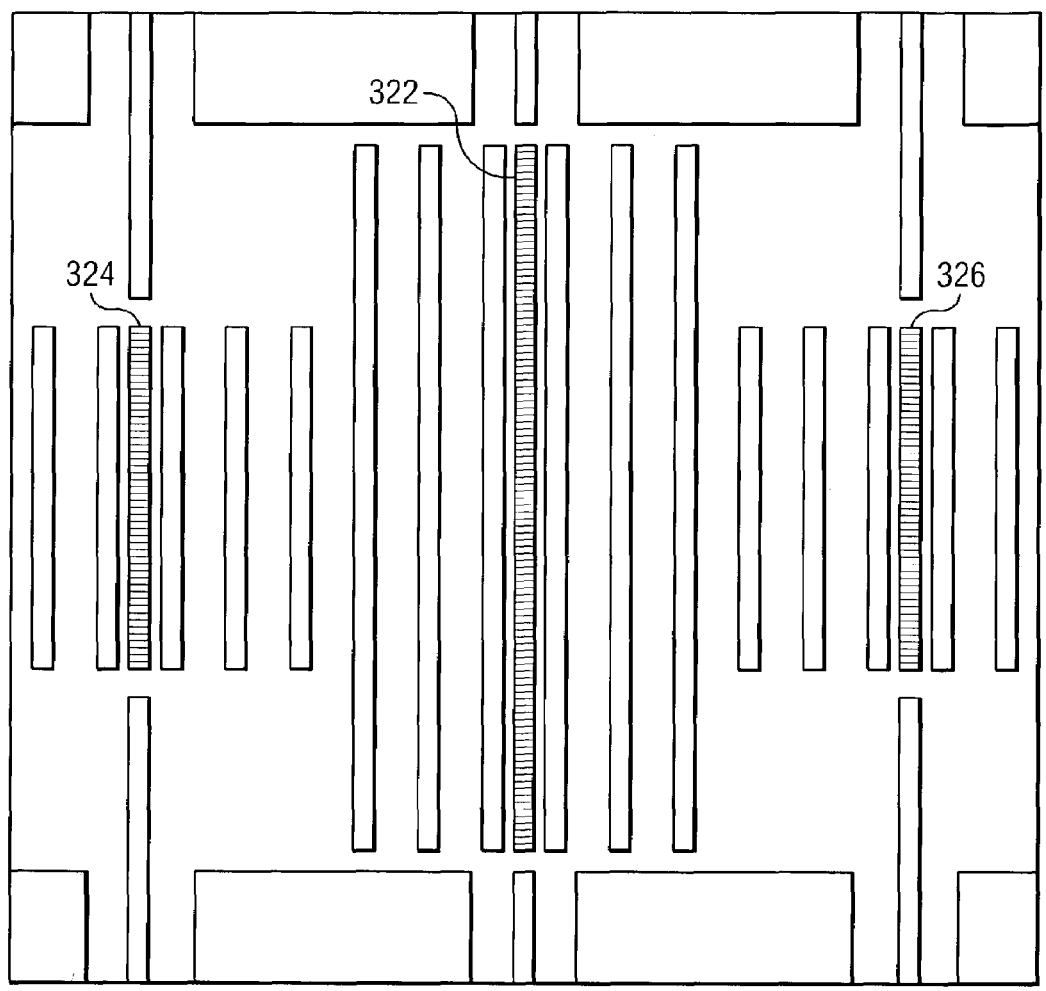

FIG. 3D depicts an example wafer with added surface features near an area of interest and gratings formed within the regions of interest. As a result of the artificial surface features, the regions have a photoresist coating thickness that is substantially uniform. Gratings 322, 324, 326 may be formed in the regions using the photoresist.

While the surface features are illustrated as long, rectangular ridges in the examples shown in FIGS. 3A–3D, other shapes, such as concentric circles, V-shapes, zig-zag shapes, etc., may be used. The sizes of surface features and distances between the surface features may also vary depending upon the viscosity of the photoresist liquid, the spin speed, or other factors that may affect coating thickness.

Figure 4:
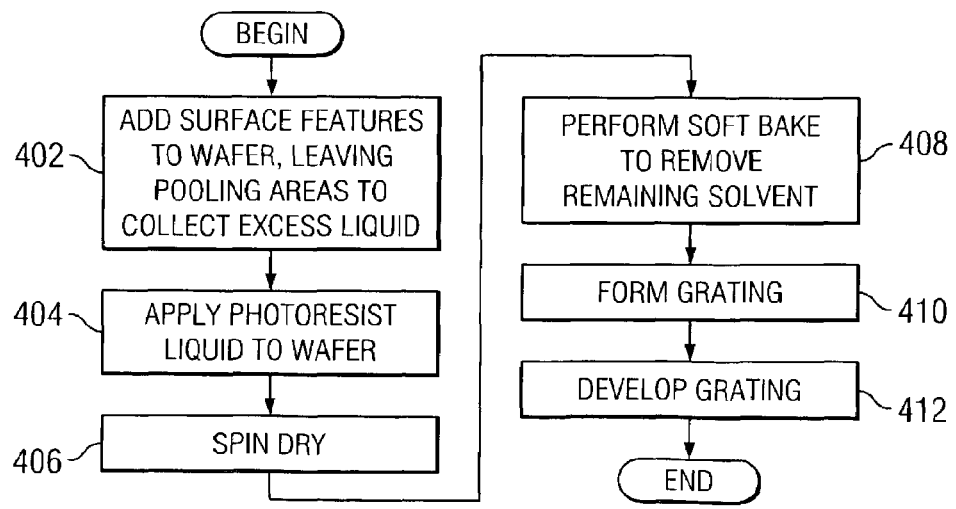
FIG. 4 is a flowchart illustrating the operation of a process of fabricating a grating for a laser on a wafer in accordance with a preferred embodiment of the present invention.

With reference to FIG. 4, a flowchart illustrating the operation of a process of fabricating a grating for a laser on a wafer is shown in accordance with a preferred embodiment of the present invention. The process begins and adds artificial surface features to the wafer, leaving pooling areas to collect excess liquid (step 402). The artificial surface features are formed near a region of interest. The spacing of the features is selected such that surface tension forces cause the liquid to be uniformly distributed between surface features, without causing a thinning effect as a result of the features being spaced to closely.

Next, the process applies the photoresist liquid to the wafer (step 404) and spins the wafer to dry the photoresist (step 406). Thereafter, the process performs a soft-bake to remove any remaining solvent (step 408). With a resulting photoresist coating thickness that is substantially uniform, the process may then form a grating (step 410) and develop the grating (step 412) using the photoresist. Then, the process ends.

Thus, the present invention solves the disadvantages of the prior art by providing a uniform coating using surface features. By taking advantage of surface tensions created by features out of the plane of the surface of a sample, photoresist thickness non-uniformities in areas of interest can be avoided. Specifically, multiple ridges or other shapes are fabricated in an area of interest to allow for uniform coating in between the ridges. Areas at either ends of the ridges can be left open to allow for excess pooling of photoresist liquid and to aid in obtaining uniform coating. The photoresist liquid or other coating fluid is applied to the sample and spun dry. A soft-bake process may also be performed to evaporate remaining solvents. An element, such as a diffractive, refractive, or reflective grating structure, may then be formed in the area of interest using the uniform photoresist coating. Also, a more accurate grayscale mask may be used in an area of interest due to the improved uniformity of photoresist coating.

What is claimed is:

1. A wafer, comprising:

at least one pre-existing surface feature out of the surface of the wafer, wherein the at least one pre-existing surface feature is a device element formed on the wafer and extending out of the surface of the wafer;

an area of interest, wherein the area of interest is an area of the wafer in which a precise device element is to be formed using a uniform photoresist coating;

a plurality of artificial surface features out of the surface of the wafer near the area of interest, wherein the plurality of artifical surface features are features formed on the wafer and extending out of the surface of the wafer and wherein the plurality of artificial surface features arc spaced such that surface tension forces cause the photoresist coating to be substantially uniform in the region of interest; and at least one pooling area on the wafer, wherein the pooling area is a vacant area on the wafer without features extending out of the surface of the wafer such that there are no additional surface tension forces in the at least one pooling area.

2. The wafer of claim 1, wherein the plurality of artificial surface features includes a plurality of ridges.

3. The wafer of claim 1, wherein the area of interest is a grating region.

4. The wafer of claim 1, wherein the at least one pooling area is located at the ends of the plurality of artificial surface features.

5. The wafer of claim 1, wherein the plurality of artificial surface features are spaced based on a viscosity of the photoresist and a spin speed at which the wafer is to be spun to dry the photoresist.

* * * * *

UNITED STATES PATENT AND TRADEMARK OFFICE
CERTIFICATE OF CORRECTION

PATENT NO. : 6,967,054 B2
DATED : November 22, 2005
INVENTOR(S) : Kirk et al.

It is certified that error appears in the above-identified patent and that said Letters Patent is hereby corrected as shown below:

Column 4,
Line 63, after "features" delete "arc" and insert -- are --.

Signed and Sealed this

Twenty-third Day of May, 2006

JON W. DUDAS
*Director of the United States Patent and Trademark Office*